US009252984B2

(12) United States Patent
Kiuchi (10) Patent No.: US 9,252,984 B2
(45) Date of Patent: *Feb. 2, 2016

(54) BUS COMMUNICATION TRANSCEIVER (71) Applicant: Renesas Electronics Corporation, Kawasaki-shi (JP)

(72) Inventor: Hideki Kiuchi, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/690,983

(22) Filed: Apr. 20, 2015

(65) Prior Publication Data

US 2015/0229494 A1 Aug. 13, 2015

Related U.S. Application Data

(63) Continuation of application No. 14/168,968, filed on Jan. 30, 2014, now Pat. No. 9,014,242.

(30) Foreign Application Priority Data

Feb. 4, 2013 (JP) .................................. 2013-019968

(51) Int. Cl.
*H04B 1/38* (2015.01)
*H04L 25/02* (2006.01)
*H04L 7/00* (2006.01)
*H03K 6/04* (2006.01)
*H04L 25/06* (2006.01)

(52) U.S. Cl.
CPC ............... *H04L 25/026* (2013.01); *H03K 6/04* (2013.01); *H04L 7/00* (2013.01); *H04L 7/0045* (2013.01); *H04L 25/06* (2013.01)

(58) Field of Classification Search
CPC ................................. H04L 7/00; H04L 25/026
USPC .................. 375/219, 220, 317, 345, 346, 350
See application file for complete search history.

(56) References Cited

U.S. PATENT DOCUMENTS 5,936,520 A * 8/1999 Luitje et al. ................... 340/517
2005/0276318 A1 12/2005 Bokhour

FOREIGN PATENT DOCUMENTS

JP 2001-274670 A 10/2001

OTHER PUBLICATIONS

U.S. Notice of Allowance issued in the parent U.S. Appl. No. 14/168,968 dated Dec. 18, 2014.

* cited by examiner

*Primary Examiner* — Kevin Kim
(74) *Attorney, Agent, or Firm* — McGinn IP Law Group, PLLC (57) ABSTRACT

A semiconductor device including a bus communication transceiver configured to be adopted in an automobile, including a transmission circuit to receive an input signal from an input node and generate a transmission signal; a bus connection node to couple with an external single wire bus to transmit the transmission signal to the external single wire bus and to receive a reception signal from the external single wire bus, the external single wire bus being coupled with an on-board battery of the automobile; a reception circuit to receive the reception signal or the transmission signal from the single wire bus to generate an output signal; and a delay time measurement circuit to measure a delay time from a rising time of the input signal to a rising time of the output signal generated from the input signal, and to generate a delay time measurement result signal group.

19 Claims, 8 Drawing Sheets

BUS COMMUNICATION TRANSCEIVER

CROSS-REFERENCE

The present application is a Continuation Application of U.S. patent application Ser. No. 14/168,968, filed on Jan. 30, 2014, which is based on Japanese Patent Application No. 2013-019968, the entire contents of which are hereby incorporated by reference.

TECHNICAL FIELD

The present invention is related to a bus communication transceiver, and more particularly, a bus communication transceiver which can be connected with a single wire bus.

BACKGROUND ART

A network protocol used when communication is carried out through a single wire bus such as LIN (Local Interconnect Network) is known. In case of LIN, the network is mainly installed on a car and is used to control various devices such as a door mirror and a door lock.

In LIN, the waveform of a signal to be inputted and outputted to or from the bus is standardized to meet various conditions. A duty ratio is contained in these conditions and the duty ratio is a ratio of a time for the signal to be higher than a predetermined voltage and a time for the signal to be lower than the predetermined voltage. The duty ratio varies according to a change of the environment of the LIN, and there is a case that the signal waveform comes off a range of the standard.

In case of LIN, a car-mounted battery is used as a power supply to supply a bus with a voltage. It is known that the power supply voltage of the car-mounted battery varies largely between 7 V and 18 V while a charging operation or a discharging operation is carried out, even when a ruled voltage is 12 V. Also, a variation of the duty ratio is sometimes caused through a variation of the total load connected with the bus.

Patent Literature 1 discloses an output circuit of an LSI. The output circuit of the LSI detects a dull waveform at the time of rising of a signal and the time of falling thereof and adjusts the waveform of the next signal based on the detection result.

CITATION LIST

[Patent literature 1] JP 2001-274670A

SUMMARY OF THE INVENTION

A bus communication transceiver is provided which can measure a delay time by using a signal and adjust the waveform of the signal based on the delay time and which is excellent in a real-time property. Another object and a new feature will become clear from the description of this Specification and the attached drawings.

According to one embodiment, the bus communication transceiver (LTr) measures the delay time based on the rising waveform of a signal and adjusts the falling waveform of the signal based on the measurement result.

According to the embodiment, the bus communication transceiver can be realized which can adjust the waveform of a signal, especially, the duty ratio to a predetermined range without undergoing influence of a variation of the supply voltage to the bus and a total of loads connected with the bus, and which is excellent in the real-time property.

DESCRIPTION OF EMBODIMENTS

Hereinafter, a bus communication transceiver according to embodiments of the present invention will be described below with reference to the attached drawings.

[First Embodiment]

Figure 1A:
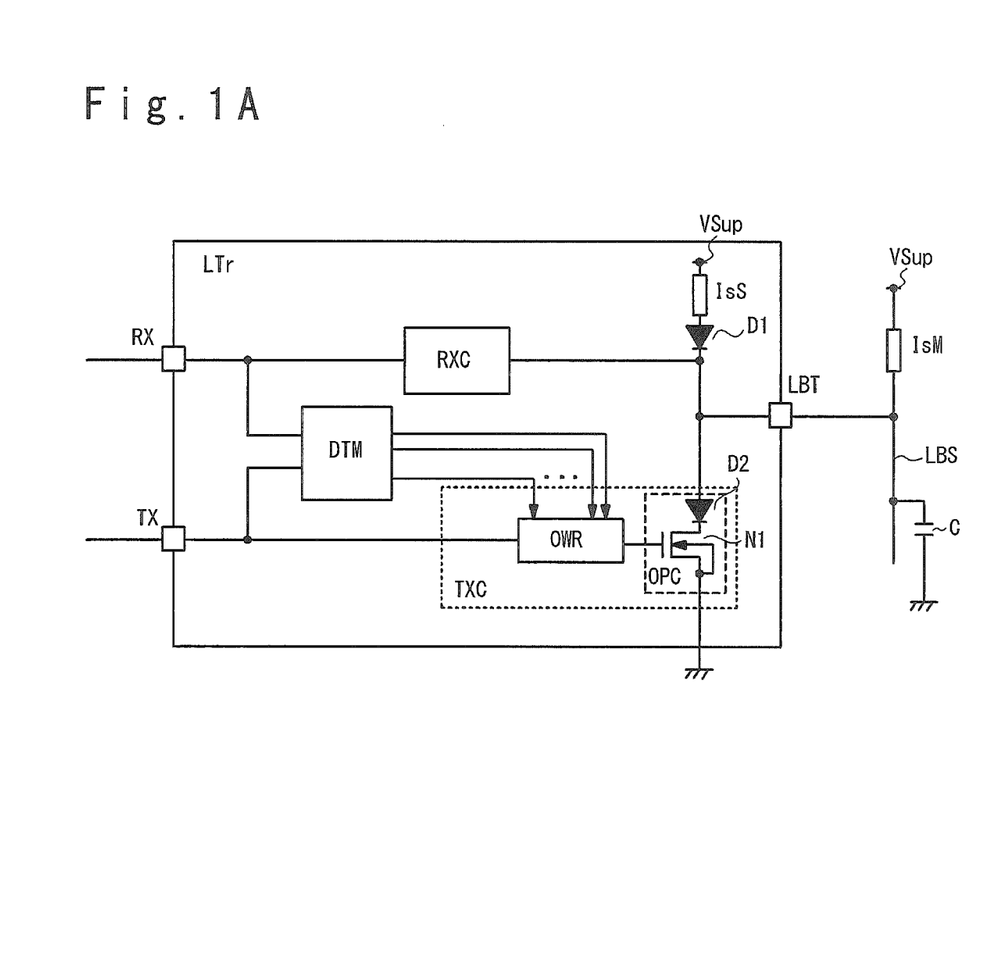
FIG. 1A is a block diagram schematically showing a configuration example of a bus communication transceiver and of a bus in a first embodiment.

FIG. 1A is a block diagram schematically showing a configuration example of the bus communication transceiver LTr and a bus LBS in a first embodiment. The components of the bus communication transceiver LTr and the bus LBS shown will be described with reference to in FIG. 1A.

The bus communication transceiver LTr shown in FIG. 1A contains a transmission signal input node TX, a transmission circuit section TXC, a bus connection node LBT, a reception circuit section RXC, a reception signal output node RX, a delay time measurement circuit section DTM, a slave resistance IsS, and a first diode D1. The transmission circuit section TXC contains an output waveform adjustment circuit section OWR and an output circuit section OPC. The output circuit section OPC contains a second diode D2 and an N-channel type transistor N1. The bus LBS contains a master resistance IsM common to buses and a capacitance C as a total bus capacitance, including capacitances of all of loads connected to the buses. One or more loads are generally connected with the bus. Besides, a second power supply voltage VSup and a ground voltage are shown in FIG. 1A. Here, a first power supply voltage VDD is not shown in FIG. 1A. It is desirable that the first power supply voltage VDD is a comparatively low voltage used in the bus communication transceiver LTr and is the voltage of 5 V or 3.3 V supplied generally from a constant voltage source (not shown). Also, the second power supply VSup is a voltage supplied from a car-mounted battery (not shown) in case of LIN and is permissible to vary in the range of 7 to 18 V.

A connection relation of the components of the bus communication transceiver LTr shown in FIG. 1A will be described. The transmission signal input node TX is connected with an input node of the output waveform adjustment circuit section OWR and a first input node of the delay time measurement circuit section DTM in common. Output nodes of the delay time measurement circuit section DTM are connected with the other input nodes of the output waveform adjustment circuit section OWR. An output node of the output waveform adjustment circuit section OWR is connected with a gate of the transistor N1. A source of the transistor N is grounded. A drain of the transistor N is connected with a cathode of the second diode D2. An anode of the second diode D2, a cathode of the first diode D1 and an input node of the reception circuit section RXC are connected with the bus connection node LBT in common. The anode of the first diode D1 is connected with one of the ends of the slave resistance IsS. The other end of the slave resistance IsS is connected with the first power supply voltage VDD. An output node of the reception circuit section RXC is connected with a second input node of the delay time measurement circuit section DTM and the reception signal output node RX in common.

A connection relation of the components of the bus LBS shown in FIG. 1A will be described. The second power supply voltage VSup is connected with one of the ends of the master resistance IsM. The other end of the master resistance IsM is connected with the bus connection node LBT and one of the ends of the capacitance C in common. The other end of the capacitance C is grounded.

An operation of the bus communication transceiver LTr in the first embodiment shown in FIG. 1A will be described. The transmission circuit section TXC transmits a transmission signal supplied from the transmission signal input node TX to the bus LBS through the bus connection node LBT after imposing a predetermined adjustment. The reception circuit section RXC outputs a reception signal received from the bus LBS through the bus connection node LBT to the reception signal output node RX.

It should be noted that the signal outputted from the transmission circuit section TXC is supplied to the bus LBS in addition to the input node of the reception circuit section RXC which is connected with the bus connection node LBT. However, a delay is caused until a rising waveform of the transmission signal externally supplied to the transmission signal input node TX passes the transmission circuit section TXC and the reception circuit section RXC and reaches the reception signal output node RX. The delay time measurement circuit section DTM measures the delay time, and generates and outputs a control signal indicating the measurement result to the output waveform adjustment circuit section OWR of the transmission circuit section TXC. The output waveform adjustment circuit section OWR adjusts the waveform of the transmission signal in response to the control signal. The output circuit section OPC transfers the transmission signal after the adjustment to the bus connection node LBT.

Figure 1B:
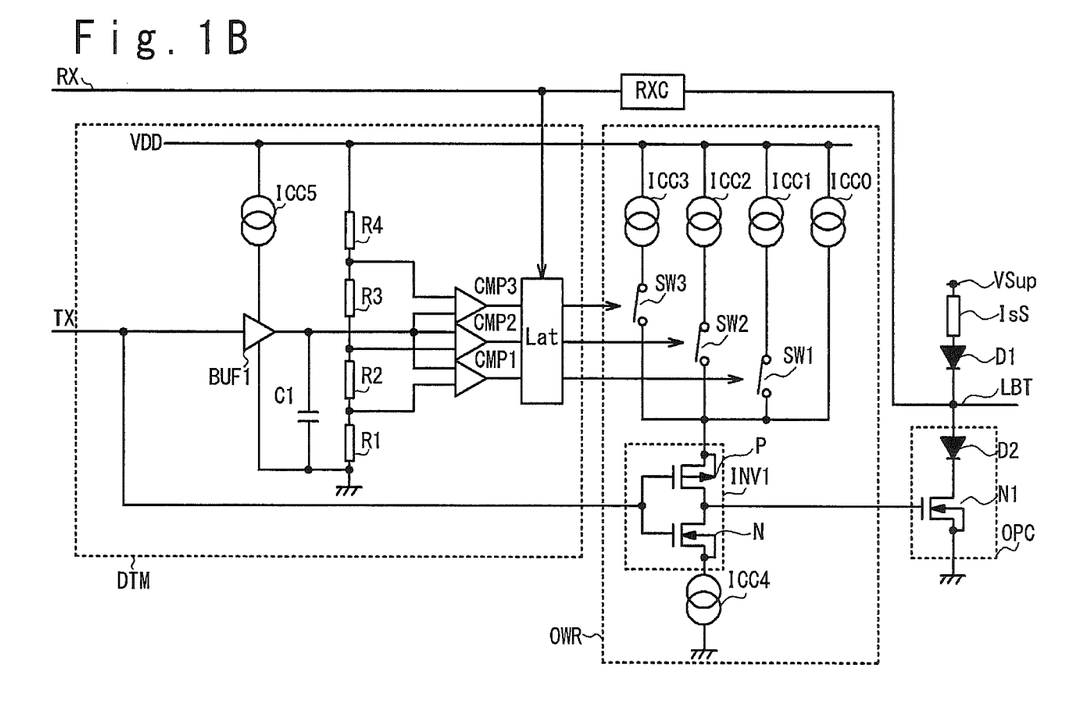
FIG. 1B is a diagram schematically showing more detailed configuration of the bus communication transceiver, especially, a delay time measurement circuit section and an output waveform adjustment circuit section in the first embodiment.

FIG. 1B is a circuit diagram schematically showing a configuration example of the bus communication transceiver LTr in the first embodiment, and especially, the more detailed configuration of the delay time measurement circuit section DTM and the output waveform adjustment circuit section OWR. Of the bus communication transceiver LTr shown in FIG. 1B, the components of the delay time measurement circuit section DTM and the output waveform adjustment circuit section OWR will be especially described.

The bus communication transceiver LTr shown in FIG. 1B contains the transmission signal input node TX, the output waveform adjustment circuit section OWR, the bus connection node LBT, the output circuit section OPC, the reception circuit section RXC, the reception signal output node RX, the delay time measurement circuit section DTM, the slave resistance IsS, and the first diode D1. The output waveform adjustment circuit section OWR contains $0^{th}$ to fourth constant current sources ICC0 to ICC4, first to third switches SW1 to SW3, and an inverter INV1. The inverter INV is a so-called CMOS (Complementary Metal Oxide Semiconductor) type inverter which contains a P-channel type transistor P and an N-channel type transistor N. The delay time measurement circuit section DTM contains a buffer BUF1, a capacitance C1, first to fourth resistances R1 to R4, first to third comparators CMP1 to CMP3 and a latch circuit section Lat. The output circuit section OPC contains the second diode D2 and the N-channel type transistor N1. Besides, the first power supply voltage VDD, the second power supply VSup and a ground voltage are further shown in FIG. 1B.

In FIG. 1B, the number of comparators CMP1 to CMP3 is 3, the number of switches SW1 to SW3 is 3, the number of resistances R1 to R4 is 4, and the number of constant current sources ICC0 to ICC5 is 6, but these numbers are an example only. That is, these numbers may be changed according to need and do not limit the configuration of the bus communication transceiver LTr in the present embodiment.

Also, in the present embodiment, the LIN is used as the bus LBS but this is an example only. That is, the bus communication transceiver in the present embodiment is applicable even in case of using a bus except the LIN. Thus, the kind of bus LBS is not limited in the present embodiment.

A connection relation of the components of the bus communication transceiver LTr shown in FIG. 1B will be described. The first power supply voltage VDD is connected with one of the ends of a fifth constant current source ICC5 and one of the ends of each of the $0^{th}$ to third constant current sources ICC0 to ICC3 in common. The other end of the first constant current source ICC is connected with one of the ends of the first switch SW1. The other end of the second constant current source ICC2 is connected with one of the ends of the second switch SW2. The other end of the third constant current source ICC3 is connected with one of the ends of the third switch SW3. The other end of the 0th constant current source ICC and the other end of each of the first to third switches SW1 to SW3 are connected with the source of the P-channel type transistor P in common. The drain of the P-channel type transistor P and the drain of the N-channel type transistor N are connected with the gate of the N-channel type transistor N1 in common. The source of the N-channel type transistor N is connected with one of the ends of the fourth constant current source ICC4. The other end of the fourth constant current source ICC4 is grounded.

Here, a group of the $0^{th}$ to third constant current sources ICC0 to ICC3 and the first to third switches SW1 to SW3 is called a current source circuit section.

The transmission signal input node TX is connected with the input node of the buffer BUF1, the gate of the P-channel type transistor P and the gate of the N-channel type transistor N in common. The output node of the buffer BUF1 is connected with one of the ends of the capacitance C and one of the input nodes of each of the first to third comparators CMP1 to CMP3 in common. The other end of the capacitance C1, one of the ends of the first resistance R1 and a negative supply node of the buffer BUF1 are grounded. The other end of the first resistance R1 is connected with the other input node of the first comparator CMP1 and one of the ends of the second resistance R2 in common. The other end of the second resistance R2 is connected with the other input node of the second comparator CMP2 and one of the ends of the third resistance R3 in common. The other end of the third resistance R3 is connected with the other input node of the third comparator CMP3 and one of the ends of the fourth resistance R4 in common. The other end of the fourth resistance R4 is connected with first power supply voltage VDD. A positive supply section of the buffer BUF1 is connected with the other end of the fifth constant current source ICC5. An output node of each of the first to third comparators CMP1 to CMP3 is connected with a corresponding one of first to third input nodes of the latch circuit section Lat. First to third output nodes of the latch circuit section Lat are connected with control signal input nodes of the first to third switches SW1 to SW3, respectively. An output node of the reception circuit section RXC is connected with the reception signal output node RX and a control signal input node of the latch circuit section Lat in common.

Besides, the second power supply VSup is connected with one of the ends of the slave resistance IsS. The other end of the slave resistance IsS is connected with the anode of the first diode D1. The cathode of the first diode D is connected with the bus connection node LBT and an input node of the reception circuit section RXC and the anode of the second diode D2 in common. The cathode of the second diode D2 is connected with the drain of the N-channel type transistor N1. The source of the N-channel type transistor N1 is grounded.

Of the bus communication transceiver LTr shown in FIG. 1B, the operation of the delay time measurement circuit section DTM and the output waveform adjustment circuit section OWR will be especially described.

The buffer BUF1 outputs an output voltage after applying a voltage inclination according to the current supplied from the fifth constant current source ICC5 to the input signal. The signal voltage outputted from the buffer BUF1 is applied between both ends of the capacitance C1. The first to fourth resistances R1 to R4 are connected in series to divide a voltage between the first power supply voltage VDD and the ground voltage and generate the first to third reference voltages. The first to third comparators CMP1 to CMP3 compare a voltage applied to the capacitance C1 with the first to third reference voltages, and generate and output first to third comparison result signals showing the comparison results to the latch circuit section Lat, respectively. The latch circuit section Lat latches the first to third comparison result signals at a rising timing of a signal outputted from the reception circuit section RXC, and continues to output.

In this case, it is important to suitability combine the magnitude of the current supplied from the fifth constant current source ICC5, the characteristics of the buffer BUF1, the capacitance value of the capacitance C1 and the resistance values of the first to fourth resistances R1 to R4 which functions as a voltage divider circuit. In this way, the time until the voltage between the both ends of the capacitance C1 reaches the first to third reference voltages can be adjusted.

That is, the delay time measurement circuit section DTM in the first embodiment measures a time period from the rising time of the input signal supplied to the transmission signal input node TX to a rising time of the output signal generated from this input signal and outputted from the reception circuit section RXC, by measuring which of the first to third reference voltages the voltage of the capacitance C1 rises to.

The rising signal waveform outputted from the output circuit section OPC to the bus connection node LBT based on the input signal receives dullness of waveform based on the capacitance C of the bus LBS and the second power supply VSup. Here, if a difference between the rising time (rising through rate) of an input signal and the rising time (rising through rate) of a rising signal at the bus connection node LBT can be reflected on a difference between a falling time (falling through rate) of the input signal and a falling time (falling through rate) of the falling signal in the bus connection node LBT, the inventor thought of that the input signal can fall within a range by adjusting a duty ratio of the input signal. The delay time measurement circuit section DTM is an example to measure the difference between the rising time (rising through rate) of the input signal and the rising time (rising through rate) of the rising signal at the bus connection node LBT. The reflection on a difference between a falling time (falling through rate) of the input signal and a falling time (falling through rate) of the falling signal of the bus connection node LBT will be described later.

In an example shown in FIG. 1B, the delay time is measured to express in four steps by using the three reference voltages. That is, the four steps for the voltage of the capacitance C1 are the $0^{th}$ step at which the voltage is less than the first reference voltage, the first step at which the voltage is equal to or more than the first reference voltage and less than the second reference voltage, the second step at which the voltage is equal to or more than the second reference voltage and less than the third reference voltage, and the third step at which the voltage is equal to or more than the third reference voltage.

The first to third comparison result signals outputted from the first to third comparators CMP1 to CMP3 are used as a comparison result signal group showing these four steps (the $0^{th}$ to the third step). Here, it is supposed that as an example, in each of the comparators, if the voltage of the capacitance C1 is lower than the reference voltage of a corresponding number, a signal in a low state is outputted, and if being higher than it, a signal in a high state is outputted. In this case, all the comparison result signals are in the low state at the $0^{th}$ step, only the first comparison result signal is in the high state at the first step, only the first and second comparison result signals are in the high state at the second step, and all the comparison result signals are in the high state at the third step.

The comparison result signal group showing these four steps is stored in the latch circuit section Lat and is transferred to the output waveform adjustment circuit section OWR as a delay time measurement result signal group.

In the output waveform adjustment circuit section OWR, each of the $0^{th}$ to third constant current sources ICC0 to ICC3 supplies a constant current to the P-channel type transistor P of the first inverter INV1. The first to third switches SW1 to SW3 connect or disconnect the first to third constant current sources 1001 to ICC3 and the first P-channel type transistor P of the inverter INV1 in response to the delay time measurement result signal group outputted from first to third latches L1 to L3 of the latch circuit section Lat, respectively. The first inverter INV1 changes a falling voltage waveform inclination of the transmission signal supplied from the transmission signal input node TX based on a total amount of current supplied from a part or entire of the $0^{th}$ to fourth constant current sources ICC0 to ICC4 and outputs to a gate of the transistor N1 of the output circuit section OPC. The drive ability of the transistor N1 (the falling voltage waveform inclination at the bus connection node LBT) is set based on the delay time measurement result at the time of rising of the input signal, and therefore, the falling time (the falling through rate) of the input signal is adjusted.

Here, the operation when the first to third switches SW1 to SW3 switch between the connection (conductive) state and the disconnection (blocking-off) state according to the delay time measurement result signal group, respectively, will be described. It is supposed that the delay time measurement result signals with a high state set the switches SW1 to SW3 to the connection state and the delay time measurement result signals with a low state set the switches SW1 to SW3 to the disconnection state, as an example. That is, at the $0^{th}$ step, all of the first to third switches SW1 to SW3 are set to the disconnection state. At the first step, only the first switch SW is set to the connection state. At the second step, only the third switch SW is set to the disconnection state. At the third step, all the switches are set to the connection state. In other words, only the $0^{th}$ constant current source ICC0 drives the inverter INV1 at the $0^{th}$ step, and the currents supplied from the constant current sources ICC1 to ICC3 are added in order and drive the inverter INV1. As a result, the current supplied to the P-channel type transistor P of a CMOS type of the inverter INV is adjusted in four steps and the voltage inclination of an intermediate signal outputted from the CMOS type inverter INV1 is adjusted in four steps.

Figure 1C:
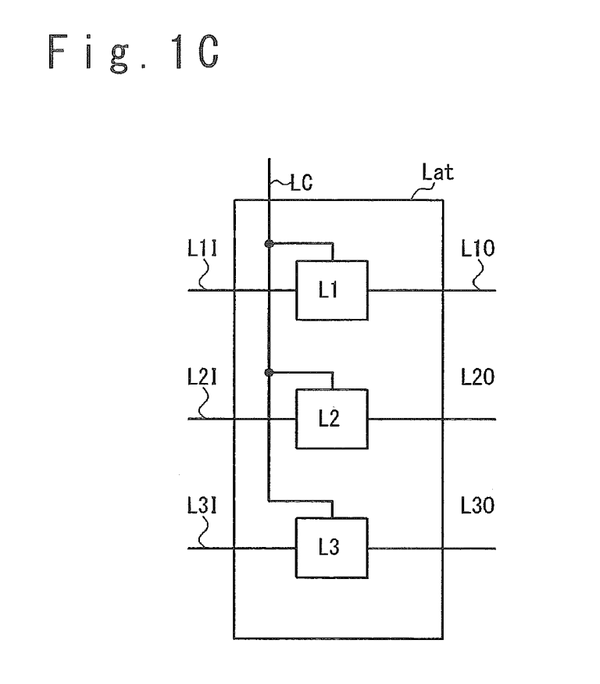
FIG. 1C is a block diagram schematically showing a configuration example of a latch circuit section in the first embodiment.

FIG. 1C is a block diagram schematically showing a configuration example of the latch circuit section Lat in the first embodiment. The components of the latch circuit section Lat in the first embodiment will be described.

The latch circuit section Lat in the first embodiment contains first to the third latches L1 to L3. Note that although it is supposed that the number of latches L1 to L3 contained in the latch circuit section Lat is 3, the number is only made to correspond to the number of comparators CMP1 to CMP3 in the present embodiment, and does not limits the configuration of the latch circuit section Lat.

A connection relation of the components of the latch circuit section Lat in the first embodiment will be described. The latch input nodes L1I to L3I of the first to third latches L1 to L3 are connected with the output nodes of the first to third comparator CMP1 to CMP3, respectively. The Latch output nodes L1O to L3O of the first to third latches L1 to L3 are connected with the control signal input nodes of the first to third switches SW1 to SW3, respectively. The control signal input nodes of the first to third latches L1 to L3 are connected with the output node of the reception circuit section RXC in common as a common control signal input node LC.

The operation of the latch circuit section Lat in the first embodiment will be described. Each of the first to third latches L1 to L3 latches the corresponding value of latch input node L1I to L3I at the rising edge of the control signal and continues to output a signal of the latched value until the next rising edge of the control signal LC.

It should be noted that each of the first to third latches L1 to L3 may be further composed of a reset signal input node (not shown). However, because the latched values of the first to third latches L1 to L3 are overwritten in the bus communication transceiver LTr in the first embodiment, every time the output signal of the reception circuit section RXC rises, it does not need a reset signal basically. In case of LIN, because it is permitted to reset the latch states of the first to third latches L1 to L3 when starting up the car-mounted electronic circuits, an ignition signal and a power on reset signal according to the start-up of an accessory power may be used as the reset signal. Also, when the values of the latch circuit section Lat upon resetting may be set to the center of all the steps (second step of four steps), the efficiency is good if the actual signal waveform is adjustable even though the through rate is larger or smaller.

Figure 2:
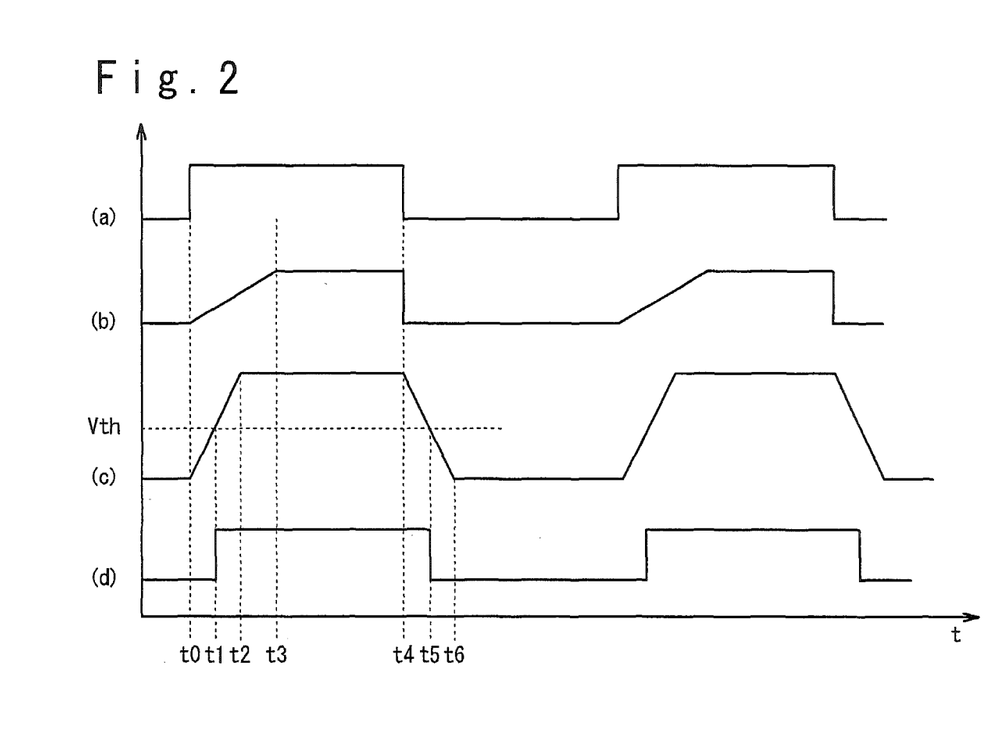
FIG. 2 is a time chart showing an example of a time change of signals obtained from each section when the bus communication transceiver in the first embodiment operates.

FIG. 2 is a time chart showing an example of the time change of a signal obtained from each section when the bus communication transceiver LTr in the first embodiment operates.

The time chart shown in FIG. 2 contains first to fourth graphs (a) to (d). The first graph (a) shows a voltage change of the input signal supplied from the transmission signal input node TX of the bus communication transceiver LTr in accompaniment with elapse of the time. The second graph (b) shows a voltage change of the buffer signal outputted from the buffer BUF1 in accompaniment with elapse of the time. The third graph (c) shows a voltage change of a bus signal which the bus communication transceiver LTr inputs or outputs from or to the bus connection node LBT, in accompaniment with elapse of the time. The fourth graph (d) shows a voltage change of the output signal which the bus communication transceiver LTr outputs from the reception signal output node RX, in accompaniment with elapse of the time. It should be noted that in each of the first to fourth graphs (a) to (d), the horizontal axis shows an elapse of the time and the vertical axis shows the voltage change of each signal.

The input signal shown in first graph (a) rises at the time t0 shown in FIG. 2 to switch from the low state to the high state. At the same time as this time, the buffer signal shown in second graph (b) is generated and the charging of the capacitance C1 is started with the voltage inclination determined based on the characteristic of the buffer BUF1, a current value of the fifth constant current source ICC5, and the capacitance value of the capacitance C and so on. This voltage inclination is mainly determined based on the current value of the fifth constant current source ICC5 and the capacitance value with the capacitance C1. At the same time, the bus signal shown in third graph (c) starts rising in a waveform having the voltage inclination determined based on the second power supply VSup, the resistance value of the master resistance IsM of bus LBS and the capacitance value of the capacitance C coupled to the bus LBS mainly. Actually, there is a delay of the inverter INV and a delay not depending on the output waveform inclination of the output circuit section OPC. However, they are as small as it is possible to ignore on the time axis.

At the time t1 shown in FIG. 2, the third graph (c) is a time when the signal intersects with a logical threshold value Vth of the reception circuit section RXC. The output signal shown in the fourth graph (d) rises at this time t1. Actually, although there is a delay not depending on the input waveform inclination of the reception circuit section RXC, it is supposed that the delay is as small as it is possible to ignore on the time axis. That is, the measured delay time becomes a time from the time t0 to the time t1 in FIG. 2. The value of the comparison result of the voltage value of the second graph (b) at the time t1 with the reference voltages supplied to the comparators CMP1 to CMP3 is latched by the latch circuit section Lat. The latch circuit section Lat latches the state of the input signal at this time and, and continues to output it.

After that, the rising of the bus signal shown in the third graph (c) completes at the time t2 shown in FIG. 2 and the rising of the buffer signal shown in the second graph (b) completes at the time t3.

The input signal shown in the first graph (a) falls down at the time t4 shown in FIG. 2. At the same time, the buffer signal shown in the second graph (b) falls down, to discharge the capacitance C1. Moreover, at the same time, the bus signal shown in the third graph (c) start falling in a waveform with the voltage inclination adjusted by the output waveform adjustment circuit section OWR.

After that, the output signal shown in the fourth graph (d) falls at the time t5 shown in FIG. 2 and the bus signal shown in the third graph (c) completes at a time t6. The time t5 is a time when the signal of the third graph (c) intersects with the logical threshold value Vth of the reception circuit section RXC.

The falling waveform of the bus signal is adjusted by using the bus communication transceiver LTr in the first embodiment.

Figure 3A:
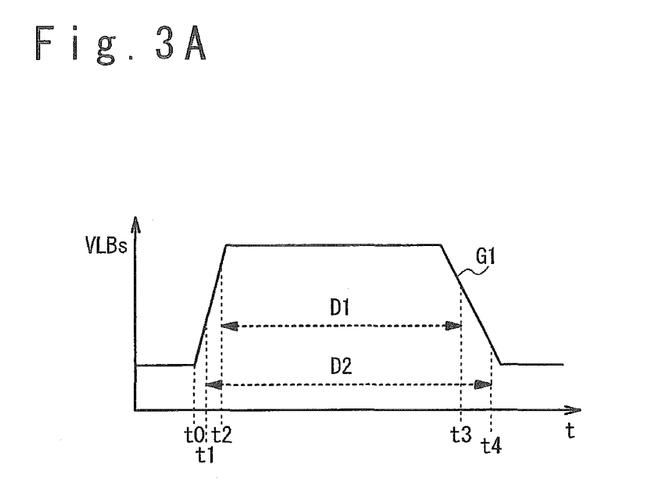
FIG. 3A is a graph showing a waveform example of a bus signal when a waveform adjustment is not carried out in the bus communication transceiver LTr in the first embodiment.
Figure 3B:
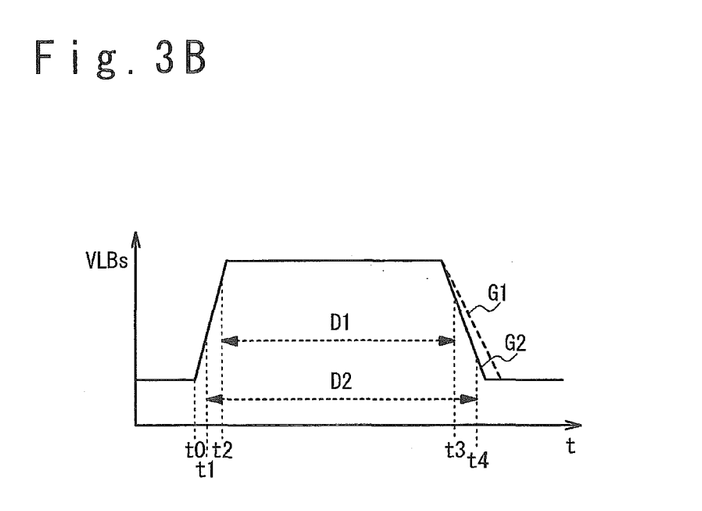
FIG. 3B is a graph showing a waveform example of the bus signal when a voltage inclination at the time of falling of the bus signal shown in FIG. 3A is adjusted in the bus communication transceiver LTr in the first embodiment.

FIG. 3A is a graph showing a waveform example of the bus signal when waveform adjustment is not carried out in the bus communication transceiver LTr in the first embodiment. FIG. 3B is s graph showing a waveform example of the bus signal when the voltage inclination at the time of falling of the bus signal shown in FIG. 3A is adjusted in the bus communication transceiver LTr in the first embodiment. The horizontal axis shows elapse of time t and the vertical axis shows the voltage VLBs of the bus signal, in FIG. 3A and FIG. 3B.

In an example shown in FIG. 3A and FIG. 3B, it is assumed that the measured delay time is shorter than a preset value (an initial value or a value latched in the latch circuit section Lat). In such a case, the voltage inclination G1 at the time of falling of the bus signal is adjusted to a steeper voltage inclination G2, i.e. the through rate of the falling waveform rate is made larger.

Figure 3C:
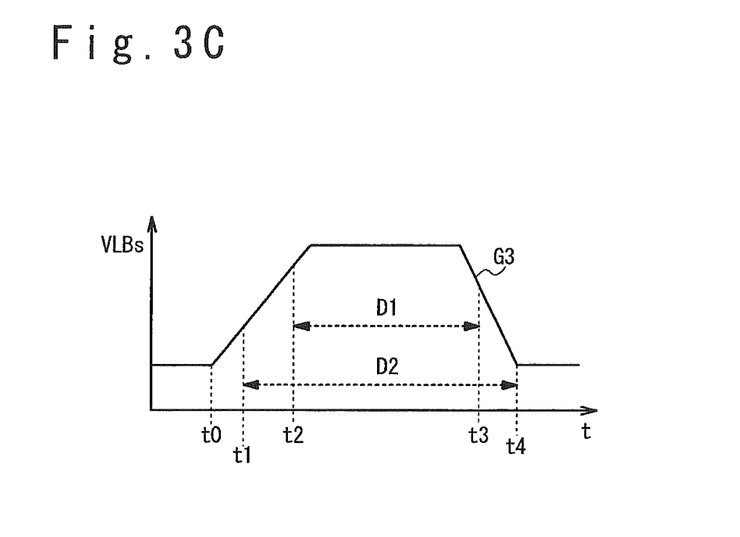
FIG. 3C is a graph showing another waveform example of the bus signal when a waveform adjustment is not carried out in the bus communication transceiver LTr in the first embodiment.
Figure 3D:
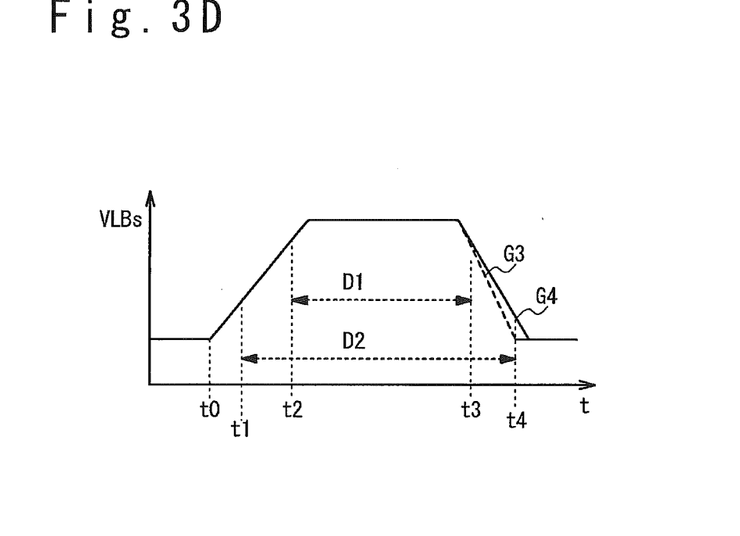
FIG. 3D is a graph showing a waveform example of the bus signal shown in FIG. 3C when the voltage inclination at the time of falling of the bus signal is adjusted in the bus communication transceiver LTr in the first embodiment.

FIG. 3C is a graph showing another waveform example of the bus signal when the waveform adjustment is not carried out in the bus communication transceiver LTr in the first embodiment. FIG. 3D is a graph showing a waveform example of the bus signal when the voltage inclination at the time of falling of the bus signal shown in FIG. 3C is adjusted in the bus communication transceiver LTr in the first embodiment. The horizontal axis shows the elapse of time t and the vertical axis shows the voltage VLBs of the bus signal, in FIG. 3C and FIG. 3D.

In the examples shown in FIG. 3C and FIG. 3D, it is assumed that the measured delay time is longer than the preset value (initial value or value latched by the latch circuit section Lat). In such a case, the voltage inclination G3 at the time of falling of the bus signal is adjusted to a gentle voltage inclination G4, i.e. it is made smaller than the falling waveform through rate.

In case of the LIN standard, a waveform duty (a high level period) is defined by using the time D1 and the time D2 shown in FIG. 3A to FIG. 3D. The time D1 is defined as a time period from the time t2 at which the bus signal rises and reaches a predetermined voltage to the time t3 at which the bus signal falls and reaches a predetermined voltage. In the same way, the time D2 is defined as a time period from the time t1 at which the bus signal rises and reaches a predetermined voltage to the time t4 at which the bus signal falls and reaches a predetermined voltage.

In the bus communication transceiver in the first embodiment, it is possible to apply an appropriate voltage inclination to the falling waveform of the bus signal for every measurement results of delay time, by suitably setting the characteristics of the buffer BUF1, the current quantities of the 0th to fifth constant current sources ICC0 to ICC5, the resistance values of the first to fourth resistances R1 to R4, and the capacitance value of the capacitance C, and so on in advance based on such definitions. As a result, it becomes possible to control the bus signal not to come off the range defined in the LIN standard and so on.

By the way, in case of the general bus standard, a reason why it is preferable that the rising time (the rising through rate) and the falling time (the falling through rate) are equal to each other will be described. In the description of FIG. 3A to FIG. 3D, a case that a single signal of the high level is used has been described because the example of the LIN standard is exemplified. However, actually, there is a case that the signal alternately takes the high level and low level, as shown in FIG. 2. In this case, the time period from the time t0 (the rising of the input signal supplied from the transmission signal input node TX) to the time t4 (the falling of the input signal supplied from the transmission signal input node TX) is generally equal to the time period from e of the rising of the input signal which types in from the time t4 to the next rising waveform of the bus signal supplied from the transmission signal input node TX. The duty at this time is called the duty ratio of 50%. Here, for simplification of the description, it is supposed that a time period while the voltage of the bus signal (waveform shown in the graph (c)) is higher than a logical threshold value Vth is a high level time, and a time period while the voltage of the bus signal is lower than the logical threshold value Vth is a low level time. In case where the high level time and the low level time are repeated in a time T, the high level time becomes longer than the low level time when the falling time is longer than the rising time as shown in FIG. 3A. On the contrary, the high level time becomes shorter than the low level time when the falling time is shorter than the rising time. In order to bring these cases close to the duty ratio of 50%, it could be understood that it is sufficient to make the rising time and the falling time equal to each other. In other words, the high level time and the low level time of the bus signal are made equal to each other by adjusting that the rising time and the falling time are made equal to each other, in the bus communication transceiver in the first embodiment. In this way, a processing possible time of the high level signal and a process possible time of the low level signal can be made maximum. In other words, according to the present embodiment, even in the general bus standard in addition to the LIN standard, the effect can be indicated in the speed-up of the signal and the stabilization of taking-in of the signal.

[Second Embodiment]

Figure 4:
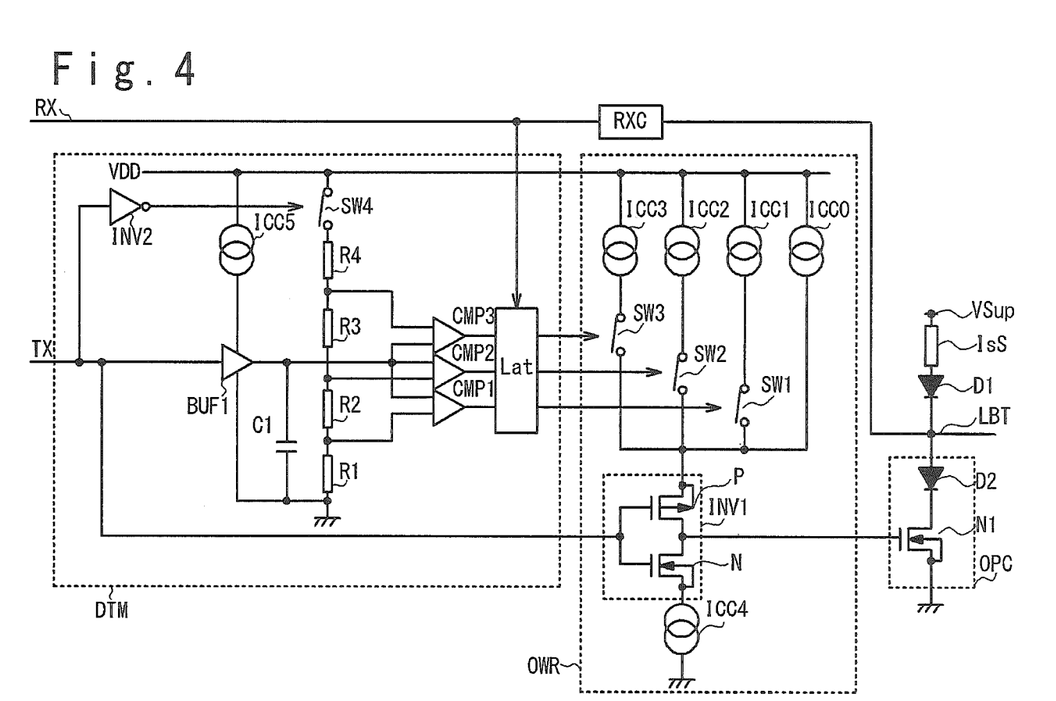
FIG. 4 is a circuit diagram schematically showing a configuration of the bus communication transceiver, especially, the configuration of the delay time measurement circuit section and the output waveform adjustment circuit section in a second embodiment.

FIG. 4 is a circuit diagram schematically showing the configuration of the bus communication transceiver LTr in a second embodiment, especially, the delay time measurement circuit section DTM and the output waveform adjustment circuit section OWR. It should be noted that because the overall configuration of the bus communication transceiver Ltr and the bus LBS in the second embodiment is the same as that of the first embodiment shown in FIG. 1A, the description is omitted.

The configuration of the bus communication transceiver LTr in the second embodiment shown in FIG. 4 is almost the same as the configuration of the bus communication transceiver LTr in the first embodiment shown in FIG. 1B and different points will be described below. That is, the bus communication transceiver LTr in the second embodiment is the same as the configuration formed by adding the second inverter INV2 and the fourth switch SW4 to the bus communication transceiver LTr in the first embodiment.

Because the other components of the bus communication transceiver LTr in the second embodiment are the same as those of the bus communication transceiver LTr in the first embodiment, a further detailed description is omitted.

The connection relation according to the second inverter INV2 and the fourth switch SW4 will be described. The input node of the second inverter INV2 is connected with the transmission signal input node TX. The output node of the second inverter INV2 is connected with the control signal input node of the fourth switch SW4. One of the ends of the fourth switch SW4 is connected with the first power supply voltage VDD. The other end of the fourth switch SW4 is connected with the other end of the fourth resistance R4.

Because the other connection relation of the components of the bus communication transceiver LTr in the second embodiment is the same as that of the bus communication transceiver LTr in the first embodiment, a further detailed description is omitted.

The operation of the second inverter INV2 and the fourth switch SW4 will be described. The second inverter INV2 outputs an output signal in a high state when the transmission signal supplied from the transmission signal input node TX is in the low state. On the contrary, the second inverter INV2 outputs the output signal in the low state when the transmission signal supplied from the transmission signal input node TX is in the high state. The fourth switch SW4 is set to a blocking-off state when the output signal of the second inverter INV2 is in the high state and set to a conductive state when the output signal of the second inverter INV2 is in the low state. Therefore, three kinds of voltages obtained by dividing the power supply voltage are supplied to the input nodes of the first to third comparators CMP1 to CMP3 when the transmission signal supplied from the transmission signal input node TX is in the high state, and the power supply voltage VDD is not supplied to the first to fourth resistances R1 to R4 when the transmission signal is in the low state. In other words, the power consumed due to the current flowing through the first to fourth resistances R1 to R4 in the time period for which the transmission signal is in the low state can be saved in the bus communication transceiver in the second embodiment.

Because the other operation of the bus communication transceiver LTr in the second embodiment is the same as that of the bus communication transceiver LTr in the first embodiment, further detailed description is omitted.

The effect of the second embodiment is in that the output waveform adjustment circuit section OWR does not carry out a waveform adjustment and the consumed power due to the current flowing through the first to fourth resistances R1 to R4 can be saved when the transmission signal is in the low state. Therefore, another configuration may be applied as far as it fits with this purpose, of course.

[Third Embodiment]

Figure 5:
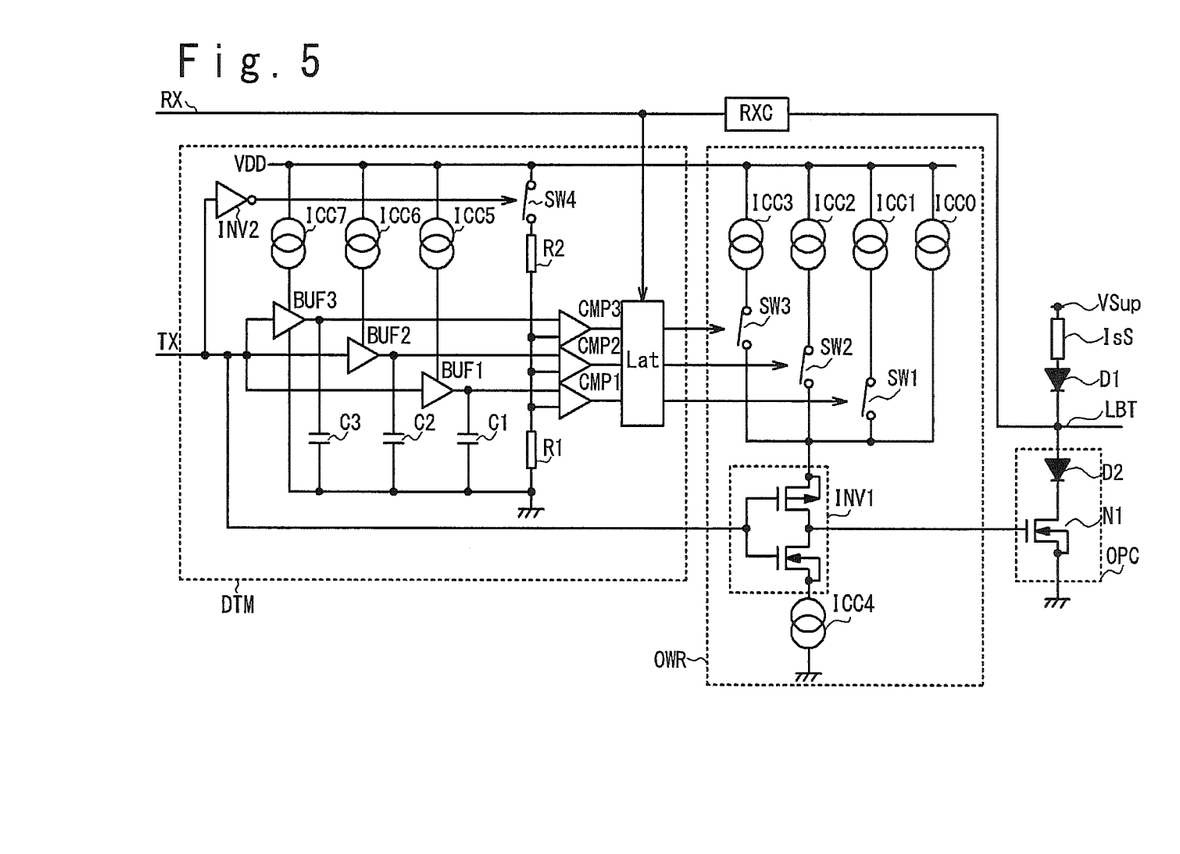
FIG. 5 is a circuit diagram schematically showing a configuration of the bus communication transceiver, especially, the configuration of the delay time measurement circuit section and the output waveform adjustment circuit section, in a third embodiment showing.

FIG. 5 is a circuit diagram schematically showing the configuration of the bus communication transceiver LTr in a third embodiment, especially, the delay time measurement circuit section DTM and the output waveform adjustment circuit section OWR. It should be noted that because the overall configuration of the bus communication transceiver Ltr and the bus LBS in the second embodiment is the same as that of the first embodiment shown in FIG. 1A, the description is omitted.

The configuration of the bus communication transceiver LTr in the second embodiment shown in FIG. 5 is almost the same as that of the bus communication transceiver LTr in the first embodiment shown in FIG. 1B other than the configuration of the delay time measurement circuit section DTM. The components of the delay time measurement circuit section DTM in the third embodiment will be described.

The delay time measurement circuit section DTM in the third embodiment contains first to third buffers BUF1 to BUF3, first to third capacitances C1 to C3, the first to third comparators CMP1 to CMP3, the latch circuit section Lat, the first and second resistances R1 and R2, fifth to seventh constant current sources ICC5 to ICC7, the second inverter INV1, and the fourth switch SW4.

Because the other components of the bus communication transceiver LTr in the third embodiment are the same as those of the first or second embodiment, a further detailed description is omitted.

The connection relation of the components of the delay time measurement circuit section DTM in the third embodiment will be described. One of the ends of each of the fifth to seventh constant current sources ICC5 to ICC7 is connected with the first power supply voltage VDD. The other end of each of the fifth to seventh constant current sources ICC5 to ICC7 is connected with one of power supply sections of corresponding one of the first to third buffers BUF1 to BUF3. The other power supply section of each of the first to third buffers BUF1 to BUF3 is grounded. Input nodes of the first to third buffers BUF1 to BUF3 and the input node of the second inverter INV2 are connected with the transmission signal input node TX in common. An output node of each of the first to third the buffers BUF1 to BUF3 is connected with one of the input nodes of each of the first to third comparators CMP1 to CMP3. Moreover, an output node of each of the first to third buffers BUF1 to BUF3 is connected with one of the ends of a corresponding one of the first to third capacitances C1 to C3. The other end of each of the first to third capacitances C1 to C3 is grounded. The output node of the second inverter INV2 is connected with the control signal input node of the fourth switch SW4. One of the ends of the fourth switch SW4 is connected with the first power supply voltage VDD. One of the ends of the first resistance R1 is grounded. The other end of the first resistance R1 is connected with one of the ends of the second resistance R2 and the other input node of each of the first to third comparators CMP1 to CMP3 in common. The other end of the second resistance R2 is connected with the other end of the fourth switch SW4. An output node of each of the first to third comparators CMP1 to CMP3 is connected with a corresponding one of the first to third input nodes of the latch circuit section Lat. A control signal input node of the latch circuit section Lat is connected with the output node of the reception circuit section RXC. The first to third output nodes of the latch circuit section Lat are connected with the control signal input nodes of the first to third switches SW1 to SW3, respectively.

Because the other connection relation of the components of the bus communication transceiver LTr in the third embodiment is the same as that of the first or second embodiment, a further detailed description is omitted.

The operation of the delay time measurement circuit section DTM in the third embodiment will be described.

The first to third buffers BUF1 to BUF3 output signals obtained by applying voltage inclinations according to the currents supplied from the fifth to seventh constant current sources to the input signal, respectively. The voltage of the signal outputted from each of the first to third buffers BUF1 to BUF3 is applied to one end of a corresponding one of the first to third capacitances C1 to C3. While the fourth switch SW4 is set to the conductive state, the first and the second resistances R1 and R2 generates a reference voltage by dividing the voltage between the first power supply voltage VDD and the ground voltage. The first to third comparators CMP1 to CMP3 compares the voltages applied to the first to third capacitances C1 to C3 with the reference voltage, and generates and outputs first to third comparison result signals showing the comparison results to the latch circuit section Lat. The latch circuit section Lat latches the first to third comparison result signals when the signal outputted from the reception circuit section RXC rises and continues to output the latched signal.

Here, it is important that the currents supplied from the fifth to seventh constant current sources ICC5 to ICC7, the capacitance values of the first to third capacitances C1 to C3, the resistance values of the first and second resistances R1 and R2 functioning as a voltage dividing circuit have been combined approximately in advance. Thus, a time until the voltage between both ends of each of the first to third capacitances C1 to C3 reaches the reference voltage can be adjusted. Also, it becomes possible to generate and output the comparison result signal group in the delay time measurement circuit section DTM in the third embodiment, like the first or second embodiment.

Because the other operation of the bus communication transceiver LTr in the third embodiment is the same as that of the first or second embodiment, a further detailed description is omitted.

It should be noted that the second inverter INV2 and the fourth switch SW4 provided in the bus communication transceiver LTr in the third embodiment are possible to be replaced with other components, like the second embodiment shown in FIG. 4. Moreover, they may be omitted like the first embodiment shown in FIG. 1B.

The present invention made by the inventor has been specifically described based on the embodiments. However, the present invention is not limited to the embodiments, and various modifications are possible in a range which does not deviate from the technical range of the present invention. Especially, the bus communication transceiver which fits with the LIN standard has been described. However, the present invention can be applied to another configuration using a single wire bus. Here, the single wire bus means a bus configuration in which a plurality of input nodes, output nodes, and bidirectional nodes are connected with a common one signal line (or one set of signal lines). The signal line may be a single line on which a single end signal is transferred, or two signal lines may transfer a set of complementary signals. Moreover, the embodiments may be freely combined in a range in which there is no contradiction.

What is claimed is:

1. A semiconductor device including a bus communication transceiver configured to be adopted in an automobile, comprising:
    an input node configured to receive an input signal;
    a transmission circuit configured to receive the input signal from the input node and to generate a transmission signal;
    a bus connection node configured to couple with an external single wire bus to transmit the transmission signal to the external single wire bus and to receive a reception signal from the external single wire bus, the external single wire bus being coupled with an on-board battery of the automobile;
    a reception circuit configured to receive the reception signal or the transmission signal from the single wire bus to generate an output signal;
    an output node configured to output the output signal; and
    a delay time measurement circuit configured to measure a delay time from a rising time of the input signal to a rising time of the output signal generated from the input signal, and to generate a delay time measurement result signal group showing the measurement results,
    wherein the transmission circuit comprises an output waveform adjustment circuit configured to adjust a voltage inclination in a falling waveform of the transmission signal generated from the input signal, based on the delay time measurement result signal group.

2. The bus communication transceiver according to claim 1, wherein the output waveform adjustment circuit comprises:
    a current source circuit configured to supply currents with different current values based on the delay time measurement result signal group; and
    an inverter circuit configured to receive the input signal and to output intermediate signals which have different voltage inclinations based on the currents supplied from the current source circuit,
    wherein the transmission circuit further comprises:
    an output circuit configured to generate the transmission signal from the intermediate signals.

3. The bus communication transceiver according to claim 2, wherein the current source circuit comprises:
    a main current source configured to supply a main current to the inverter circuit;
    a plurality of sub-current sources configured to supply a plurality of sub-currents to the inverter circuit, respectively;
    a plurality of switches connected with the plurality of sub-current sources in series, to carry out a switching operation to set states between a part or whole of the plurality of sub-currents and the inverter circuit to conductive states or blocking-off states.

4. The bus communication transceiver according to claim 3, wherein the delay time measurement circuit comprises:
    a buffer constant current source configured to supply a buffer current;
    a buffer configured to receive the input signal and to output the voltage inclination based on the buffer current;
    a capacitance connected with an output node of the buffer;
    a plurality of resistances connected in series between a first power supply voltage and a second power supply voltage to generate a plurality of reference voltages generated by dividing a voltage between the first power supply voltage and the second power supply voltage;
    a plurality of comparators configured to compare a voltage applied to the capacitance with the plurality of reference voltages, and to output the comparison result signal group indicating the comparison results; and
    a latch circuit configured to latch the comparison result signal group at a time of rising of the output signal to output the latched signals as the delay time measurement result signal group.

5. The bus communication transceiver according to claim 3, wherein the delay time measurement circuit comprises:
    a plurality of buffer constant current sources to supply a plurality of buffer currents;
    a plurality of buffers configured to receive the input signal and to output a plurality of voltage inclinations respectively corresponding to the plurality of buffer currents;
    a plurality of capacitances connected with output nodes of the plurality of buffers, respectively;
    a plurality of resistances connected in series between a first power supply voltage and a second power supply voltage, to generate reference voltages by dividing a voltage between the first power supply voltage and the second power supply voltage;

a plurality of comparators configured to respectively compare voltages applied to the plurality of the capacitances with the reference voltages and to output a comparison result signal group showing comparison results; and a latch circuit configured to latch the comparison result signal group in response to a rising time of the output signal to output as a delay time measurement result signal group.

6. The bus communication transceiver according to claim 4, wherein the latch circuit comprises:

a plurality of latches having input nodes connected with output nodes of the plurality of comparators, and output nodes connected with control signal input nodes of the plurality of switches, respectively.

7. The bus communication transceiver according to claim 4, further comprising:

a switch configured to connect the plurality of resistances with the first or second power supply voltage during measurement of the delay time, and to disconnect the plurality of resistances from the first or second power supply voltage during a part or an entirety of a time period for which the measurement of the delay time is unnecessary.

8. The bus communication transceiver according to claim 6, further comprising:

a switch configured to connect the plurality of resistances with the first or second power supply voltage during measurement of the delay time, and to disconnect the plurality of resistances from the first or second power supply voltage during a part or an entirety of a time period for which the measurement of the delay time is unnecessary.

9. A bus communication transceiver configured to be adopted in an automobile, comprising:

a transmission circuit configured to receive an input signal and to generate a transmission signal based thereon;

a bus connection node configured to couple with an external single wire bus to transmit the transmission signal to the external single wire bus and to receive a reception signal from the external single wire bus, the external single wire bus being coupled with an on-board battery of the automobile;

a reception circuit configured to receive the reception signal or the transmission signal from the single wire bus to generate an output signal; and a delay time measurement circuit configured to measure a delay time from a rising time of the input signal to a rising time of the output signal generated from the input signal, and to generate a delay time measurement result signal group showing the measurement results, wherein the transmission circuit comprises an output waveform adjustment circuit configured to adjust a voltage inclination in a falling waveform of the transmission signal generated from the input signal, based on the delay time measurement result signal group.

10. The bus communication transceiver according to claim 9, further comprising:

an input node configured to receive the input signal and to provide the input signal to the transmission circuit.

11. The bus communication transceiver according to claim 9, further comprising:

an output node configured to output the output signal.

12. The bus communication transceiver according to claim 9, wherein the output waveform adjustment circuit comprises:

a current source circuit configured to supply currents with different current values based on the delay time measurement result signal group; and an inverter circuit configured to receive the input signal and to output intermediate signals which have different voltage inclinations based on the currents supplied from the current source circuit, wherein the transmission circuit further comprises:

an output circuit configured to generate the transmission signal from the intermediate signals.

13. The bus communication transceiver according to claim 12, wherein the current source circuit comprises:

a main current source configured to supply a main current to the inverter circuit;

a plurality of sub-current sources configured to supply a plurality of sub-currents to the inverter circuit, respectively;

a plurality of switches connected with the plurality of sub-current sources in series, to carry out a switching operation to set states between a part or whole of the plurality of sub-currents and the inverter circuit to conductive states or blocking-off states.

14. The bus communication transceiver according to claim 13, wherein the delay time measurement circuit comprises:

a buffer constant current source configured to supply a buffer current;

a buffer configured to receive the input signal and to output the voltage inclination based on the buffer current;

a capacitance connected with an output node of the buffer;

a plurality of resistances connected in series between a first power supply voltage and second power supply voltage to generate a plurality of reference voltages generated by dividing a voltage between the first power supply voltage and the second power supply voltage;

a plurality of comparators configured to compare a voltage applied to the capacitance with the plurality of reference voltages, and to output the comparison result signal group indicating the comparison results; and a latch circuit configured to latch the comparison result signal group at a time of rising of the output signal to output the latched signals as the delay time measurement result signal group.

15. The bus communication transceiver according to claim 13, wherein the delay time measurement circuit comprises:

a plurality of buffer constant current sources to supply a plurality of buffer currents;

a plurality of buffers configured to receive the input signal and to output a plurality of voltage inclinations respectively corresponding to the plurality of buffer currents;

a plurality of capacitances connected with output nodes of the plurality of buffers, respectively;

a plurality of resistances connected in series between a first power supply voltage and a second power supply voltage, to generate reference voltages by dividing a voltage between the first power supply voltage and the second power supply voltage;

a plurality of comparators configured to respectively compare voltages applied to the plurality of the capacitances with the reference voltages and to output a comparison result signal group showing comparison results; and a latch circuit configured to latch the comparison result signal group in response to a rising time of the output signal to output as a delay time measurement result signal group.

16. The bus communication transceiver according to claim 14, wherein the latch circuit comprises:

a plurality of latches having input nodes connected with output nodes of the plurality of comparators, and output nodes connected with control signal input nodes of the plurality of switches, respectively.

17. The bus communication transceiver according to claim 14, further comprising:

a switch configured to connect the plurality of resistances with the first or second power supply voltage during measurement of the delay time, and to disconnect the plurality of resistances from the first or second power supply voltage during a part or an entirety of a time period for which the measurement of the delay time is unnecessary.

18. The bus communication transceiver according to claim 16, further comprising:

a switch configured to connect the plurality of resistances with the first or second power supply voltage during measurement of the delay time, and to disconnect the plurality of resistances from the first or second power supply voltage during a part or an entirety of a time period for which the measurement of the delay time is unnecessary.

19. A method for a semiconductor device including a bus communication transceiver configured to be adopted in an automobile, comprising:

receiving, by an input node, an input signal;

receiving, by a transmission circuit, the input signal from the input node and generating a transmission signal;

coupling a bus connection node with an external single wire bus and transmitting the transmission signal to the external single wire bus and receiving a reception signal from the external single wire bus, the external single wire bus being coupled with an on-board battery of the automobile;

receiving, by a reception circuit, the reception signal or the transmission signal from the single wire bus and generating an output signal;

outputting, by an output node, the output signal; and measuring, by a delay time measurement circuit, a delay time from a rising time of the input signal to a rising time of the output signal generated from the input signal, and generating a delay time measurement result signal group showing the measurement results, wherein the generating, by the transmission circuit, comprises adjusting a voltage inclination in a falling waveform of the transmission signal generated from the input signal, based on the delay time measurement result signal group.

* * * * *